(12) United States Patent
Bielak

(10) Patent No.: US 9,375,910 B2
(45) Date of Patent: Jun. 28, 2016

(54) FORMING A FLEXOGRAPHIC PLATE

(71) Applicant: Eastman Kodak Company, Rochester, NY (US)

(72) Inventor: Richard R. Bielak, Port Coquitlam (CA)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/509,253

(22) Filed: Oct. 8, 2014

(65) Prior Publication Data

US 2016/0101614 A1  Apr. 14, 2016

(51) Int. Cl.
*G06K 15/02* (2006.01)
*B41C 1/00* (2006.01)

(52) U.S. Cl.
CPC ............... *B41C 1/003* (2013.01); *G06K 15/18* (2013.01); *G06K 15/1822* (2013.01); *G06K 15/1825* (2013.01)

(58) Field of Classification Search
CPC  G06K 15/18; G06K 15/1822; G06K 15/1825
See application file for complete search history.

(56) References Cited

U.S. PATENT DOCUMENTS

| | | | |
|---|---|---|---|
| 6,226,417 B1* | 5/2001 | Yamagata et al. | 382/289 |
| 2010/0092092 A1* | 4/2010 | Sakaue | 382/200 |
| 2011/0043865 A1* | 2/2011 | Wagner | 358/3.27 |
| 2012/0121186 A1* | 5/2012 | Dardikman et al. | 382/195 |

* cited by examiner

*Primary Examiner* — John Fitzgerald
*Assistant Examiner* — John M Royston
(74) *Attorney, Agent, or Firm* — Nelson A. Blish; William R. Zimmerli

(57) ABSTRACT

A system for forming a flexographic plate includes a digital front end (DFE) for rendering a halftone image; wherein the DFE identifies pixels in the halftone image as being part of an edge region or interior region based on the pixels proximity to an edge image features; wherein the DFE applies a fine pattern to each of the edge regions; wherein the DFE applies a coarse pattern to each of the interior regions; an interface for transmitting the patterned image to an imaging device; and wherein the imaging device images the flexographic plate with the patterned image.

7 Claims, 14 Drawing Sheets

FORMING A FLEXOGRAPHIC PLATE

CROSS REFERENCE TO RELATED APPLICATIONS

Reference is made to commonly-assigned copending patent application Ser. No. 14/509,241 filed Oct. 8, 2014, entitled FLEXOGRAPRIC SURFACE PATTERNS, by Bielak; the disclosure of which is incorporated herein.

FIELD OF THE INVENTION

The present invention relates to a method forming an image on a flexographic plate.

BACKGROUND OF THE INVENTION

In graphic arts technology, a number of well-established printing processes utilize image carriers with three-dimensional (3D) representation of data, the most popular of them being flexographic printing, which uses flexible relief plates or sleeves. The relief is composed of the raised features on the plate such as the features labeled 204, 208, and 212 in FIG. 2. It is the relief that accepts and transfers ink to the substrate. In a traditional flexographic prepress process with chemical etching there is no possibility of fine control of relief properties other than depth of relief 216.

Flexographic printing uses a flexible relief plate to print on a wide variety of substrates including paper, cardboard, plastic, and metal films. A simplified diagram of a flexographic printing press is shown in FIG. 1. Ink 10 in a fountain pan is taken up by a rubber roller 12 and transferred to the surface of the Anilox roller 14. The surface of the Anilox roller is composed of an array of indented cells that allow careful metering of the ink volume. A doctor blade 16 removes any excess ink from the roller before the ink is transferred to the printing plate cylinder 18. Mounted on the plate cylinder is a flexographic printing plate 20. The final step transfers the ink from the plate to the substrate 22 with the impression cylinder 24 supplying support for the substrate.

The process used to produce an image on flexible relief plate usually comprises the following steps:
 Exposing the back of the plate to UV light;
 Exposing an intermediate film to the desired image;
 Laminating the film to the top of the plate;
 Exposing the plate though the film using UV light;
 Removing the film;
 Using a solvent to wash away the unexposed plate material;
 Applying additional exposure to harden the plate; and
 Drying the plate to remove as much of the solvent as possible.

The back exposure is used to establish the floor of the plate. The intensity of the exposure decreases as the illumination penetrates the plate because of absorbers added to the plate material. Once the intensity drops below a threshold value, there is insufficient cross linking in the polymer comprising the plate and the remaining under-exposed polymer can be washed away. This is usually the top 0.5 mm of the plate. To form the relief, the front of the plate is exposed, through an image layer with enough intensity that sufficient cross linking occurs all the way down to the plate floor.

For every opening in the image layer, a cone of UV light with an angle of about 40 degrees from a normal to the plane propagates through the plate forming cone shaped relief dots. A cross-section of a plate 200 is shown in FIG. 2. The following features are depicted in the cross-section 200: a solid area 204; an isolated dot 208; and an array 212 of closely spaced dots created by a halftone screen. The height of the plate relief is shown by numeral 216 and plate floor by numeral 220.

Ink uniformity and density can be improved if a surface pattern or texture is applied to the flat tops of the relief as shown in the FIG. 3. The stretched checkerboard pattern 304 is composed of 5×10 micron rectangles and works well for process inks printed on a paper substrate.

Such a fine pattern has an additional advantage in that it allows the edges of printing features to be well defined. The pattern does have its limits. When printing on plastic substrates, voids can appear in large features due to air entrapment. The pattern also performs poorly if large volumes of ink need to be transferred to the substrate. To eliminate these problems, a coarser pattern is required. However, a coarser pattern will compromise edge definition.

In flexographic printing, large solid areas of relief can suffer from a number of artifacts. The ink deposits unevenly, resulting in a reduction in color density and in a mottled appearance to the solid. Ink can be squeezed off the relief near edges resulting in low ink density just inside the edge and high density just outside the edge. Air bubbles trapped between the plate and substrate can cause voids to appear at the trailing edge of large features. Prior art exists to mitigate some these problems as described below.

Early flexography printing relied on a flat, smooth surface for the relief. FIG. 4 shows a section of halftone with a smooth relief. In large solid regions of image, the ink deposition was uneven resulting in a reduction in measured ink density. With high impression force, ink often squeezed out at relief edges reducing ink density just inside the edge with a ring of high density ink just outside the edge.

One method of improving the performance of the plate is to apply a very fine pattern 504, shown in FIG. 5, to the surface of the relief. This creates a texture that is smaller than the resolution of the flexographic printing method. The stretched checkerboard of FIG. 5 is one such example.

The dimensions of the pixels shown in FIG. 5 are 5.3 by 10.6 microns. The pixels that form on the plate are slightly smaller, creating small gaps between pixels at the corners. The edges of the pixels fall off at an angle of about 40 degrees to a valley floor, 3 to 4 microns below the relief surface. This shape allows ink to settle in the valleys and to migrate between valleys at the pixel corners. The result is a more even deposition of ink on the substrate.

Some imaging devices used to make flexographic plates do not have sufficient resolution to image very fine textures. For these devices, another method using coarser textures was developed. The problem with coarser textures is that the dot edge can be compromised. To avoid this, patterning is suppressed a set distance from the dot edge (the keep-away). FIG. 10 shows one implementation of this method. A coarser pattern 1004 is used in the interior of the relief and a 2 pixel keep-away 1008 is implemented at the edges. This keep-away 1008 conserves the shape of the dot.

The pattern shown in FIG. 10 is a regularly spaced pattern but this is not a requirement of the method. Stochastic screening methods have been used to randomly locate voids in the relief areas without violating the keep-away rule. An example of the stochastic method can be seen in the lower left corner of FIG. 3 identified as 'Traditional Plate Cell Patterning' 308.

To overcome the weakness of these methods, this invention combines a fine pattern at the edges of printing features with a coarser pattern in the interior of the features.

SUMMARY OF THE INVENTION

Briefly, according to one aspect of the present invention a system for forming a flexographic plate includes a digital front end (DFE) for rendering a halftone image; wherein the DFE identifies pixels in the halftone image as being part of an edge region or interior region based on the pixels proximity to an edge image features; wherein the DFE applies a fine pattern to each of the edge regions; wherein the DFE applies a coarse pattern to each of the interior regions; an interface for transmitting the patterned image to an imaging device; and wherein the imaging device images the flexographic plate with the patterned image.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

While the present invention is described in connection with one of the embodiments, it will be understood that it is not intended to limit the invention to this embodiment. On the contrary, it is intended to cover alternatives, modifications, and equivalents as covered by the appended claims.

Figure 1:
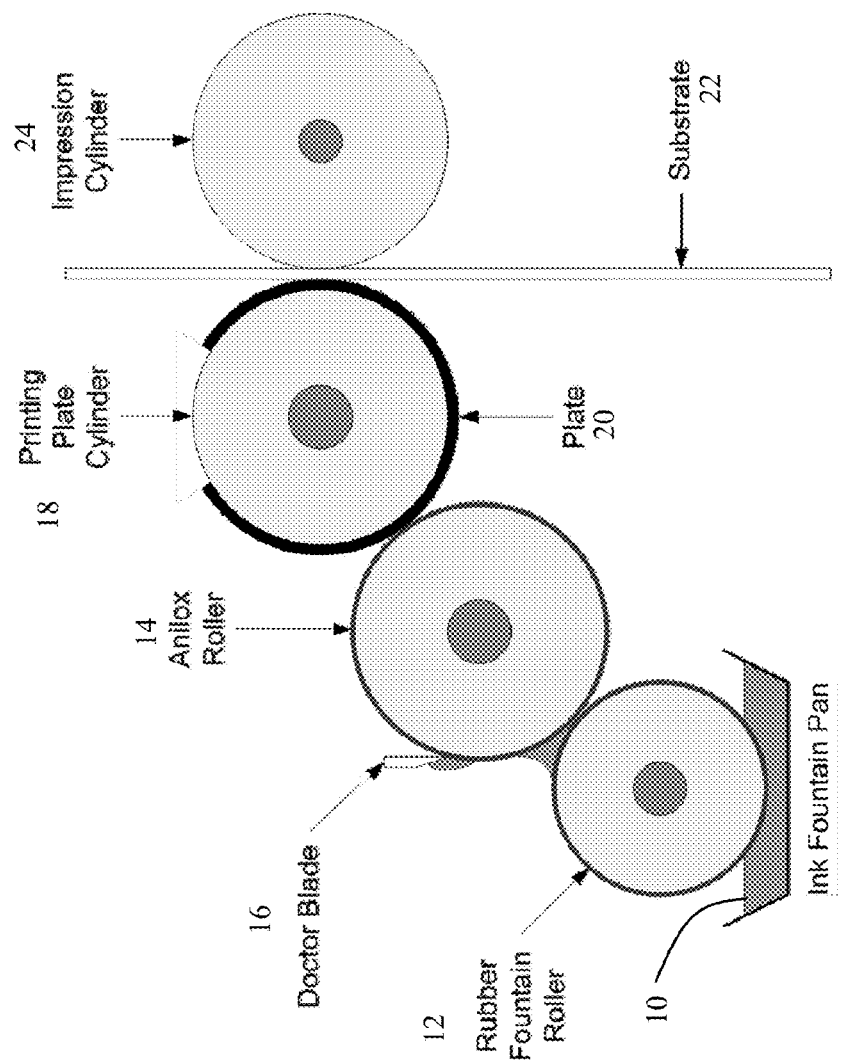
FIG. 1 shows simplified diagram of a flexographic printing press (prior art)
Figure 2:
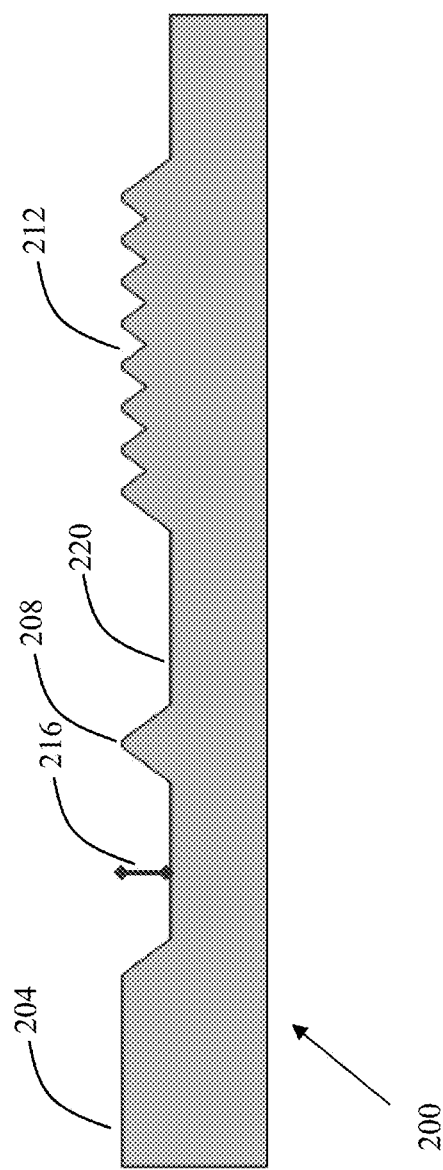
FIG. 2 imaged plate cross section (prior art)
Figure 3:
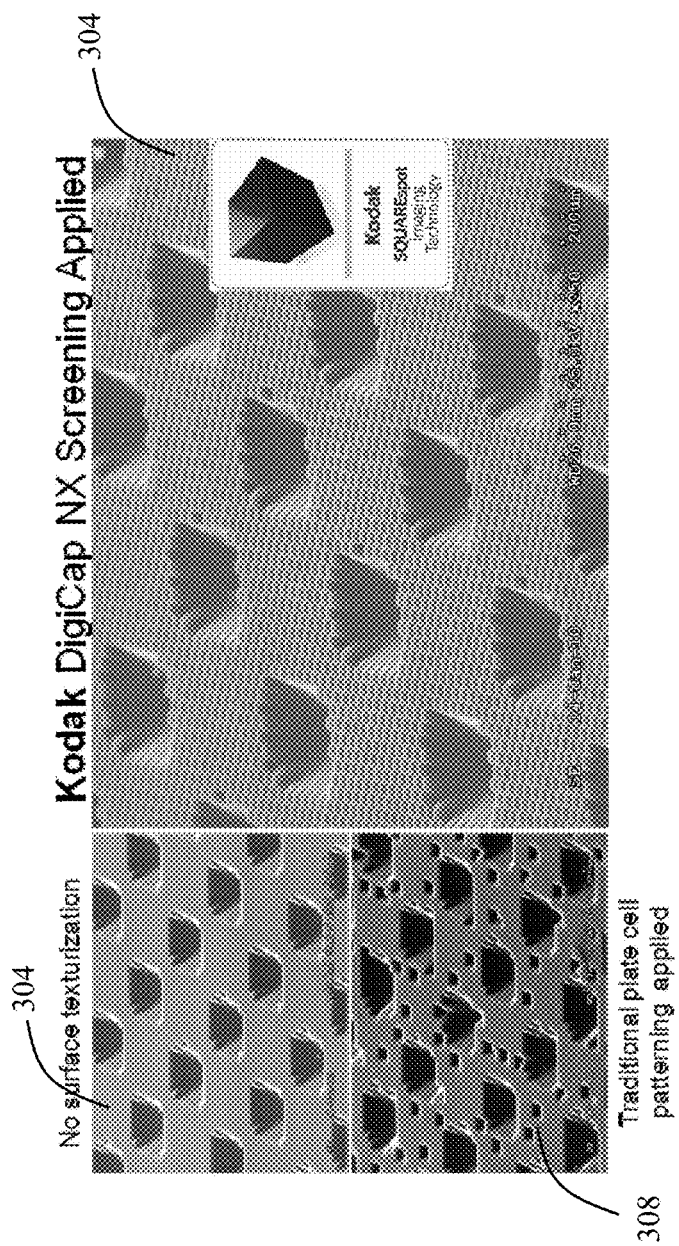
FIG. 3 shows texture applied to the flat tops of the printing relief (prior art)
Figure 4:
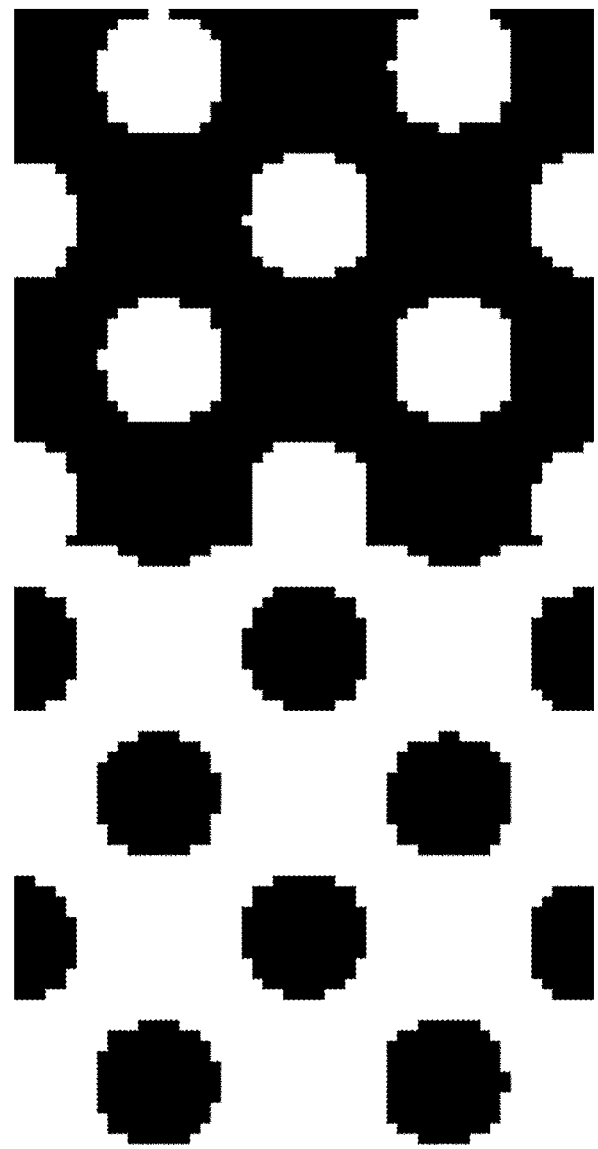
FIG. 4 shows a section of halftone with a smooth relief (prior art)
Figure 5:
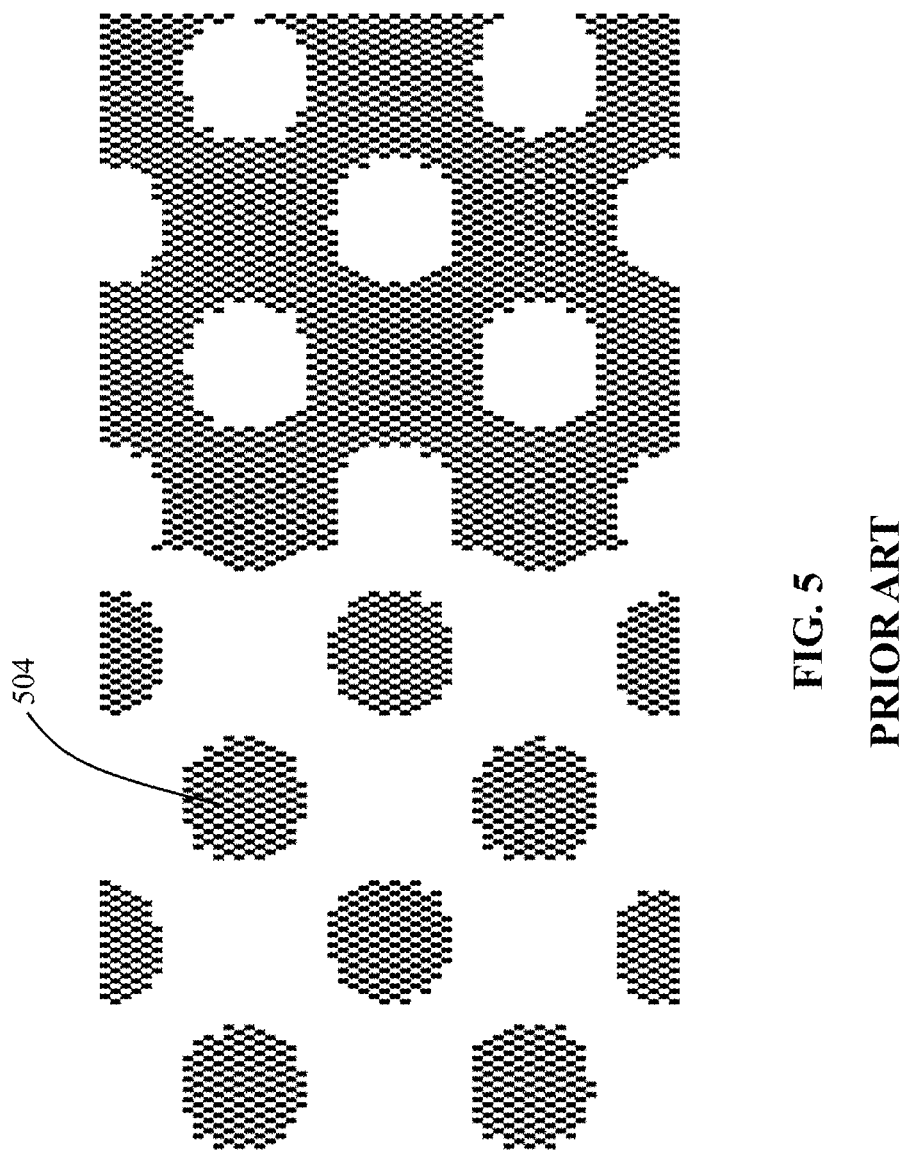
FIG. 5 shows a very fine pattern applied to the surface of the relief.
Figure 6:
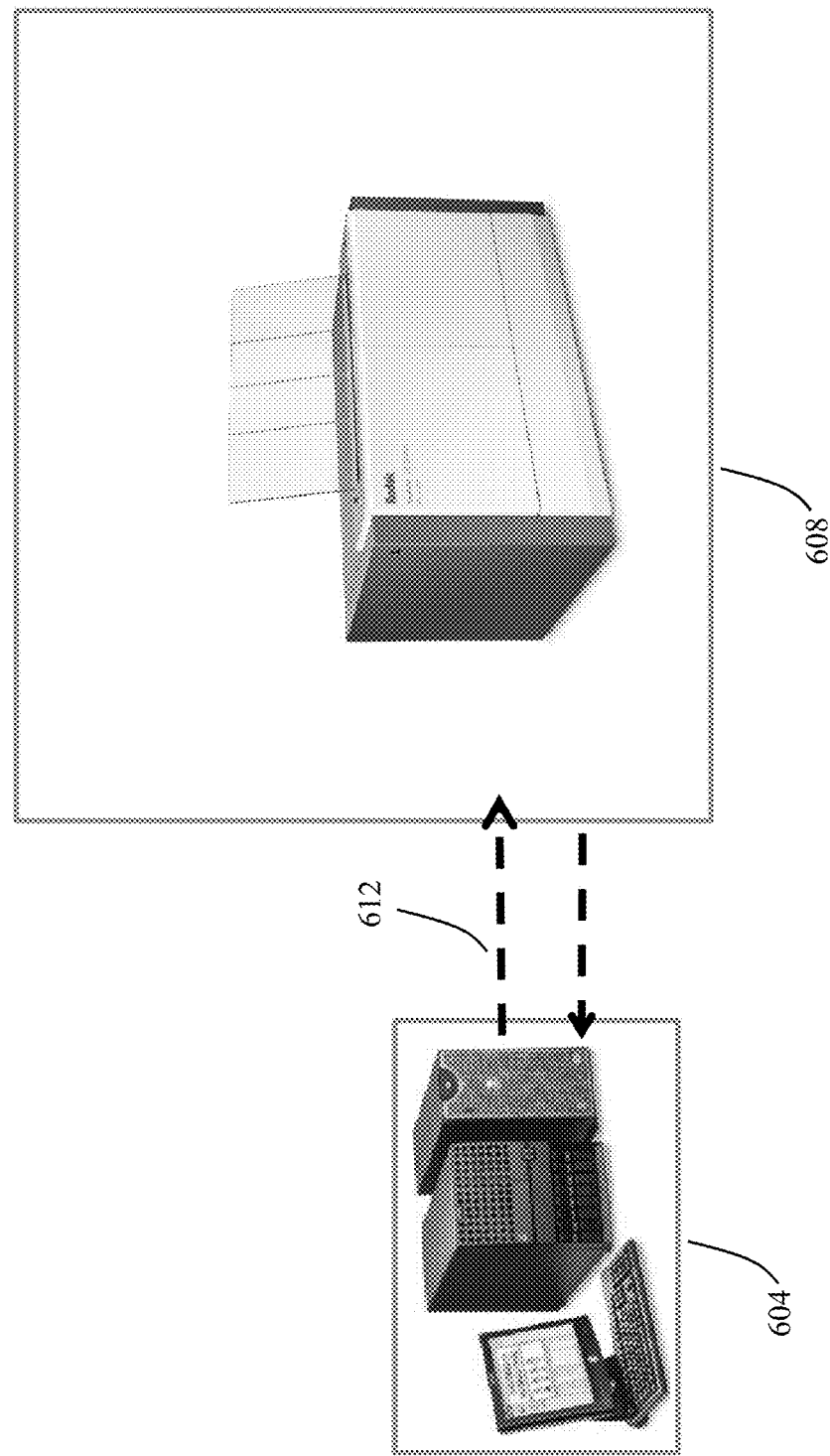
FIG. 6 represents in diagrammatic form of a digital front end driving an imaging device (prior art)

FIG. 6 shows an imaging device 608. The imaging device is driven by a digital front end (DFE) 604. The DFE receives printing jobs in a digital form from desktop publishing (DTP) systems (not shown), and renders the digital information for imaging. The rendered information and imaging device control data are communicated between DFE 604 and imaging device 608 over interface line 612.

Figure 7:
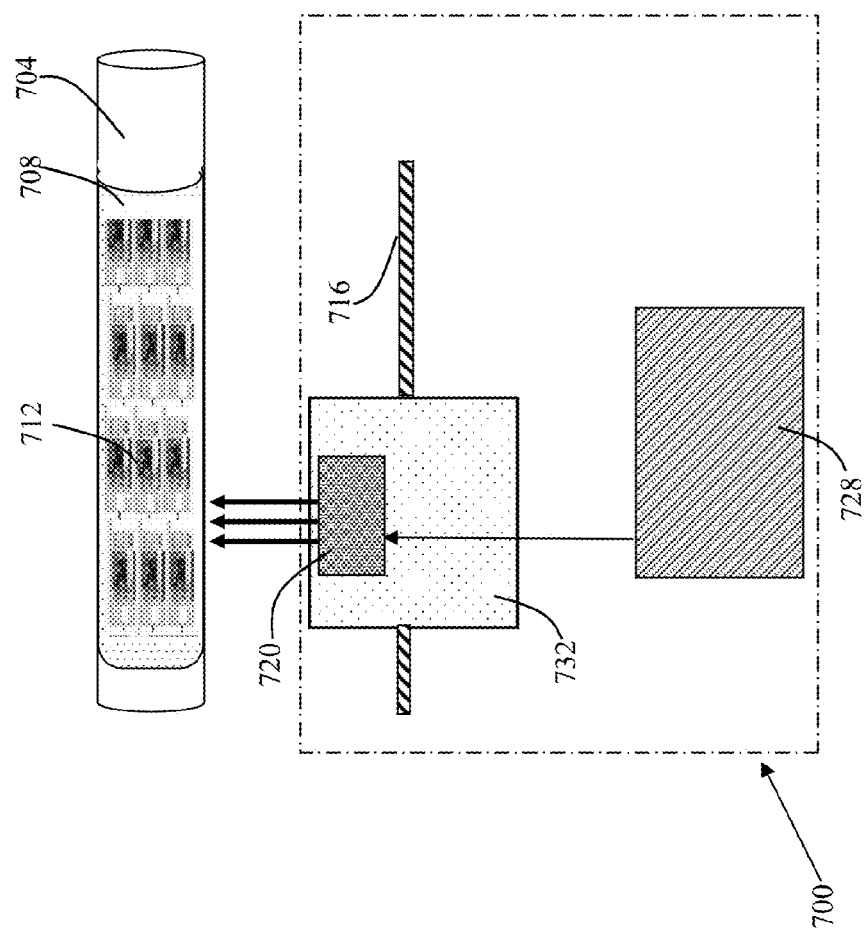
FIG. 7 represents in diagrammatic form the laser imaging head situated on the imaging carriage imaging on a plate mounted on an imaging cylinder (prior art)

FIG. 7 shows an imaging system 700. The imaging system 700 includes an imaging carriage 732, on which an imaging head 720 is mounted, and the imaging head 720 is controlled by controller 728. The imaging head 720 is configured to image on a substrate 708. The substrate can be a film attached as a mask to a flexographic plate, or alternatively a flexographic plate that will be directly imaged by imaging system 700. The substrate 708 is mounted on a rotating cylinder 704 for exposure. The carriage 732 is adapted to move substantially in parallel to cylinder 704 guided by an advancement screw 716. The substrate 708 is imaged by imaging head 720 to form imaged data 712 on substrate 708.

Figure 8:
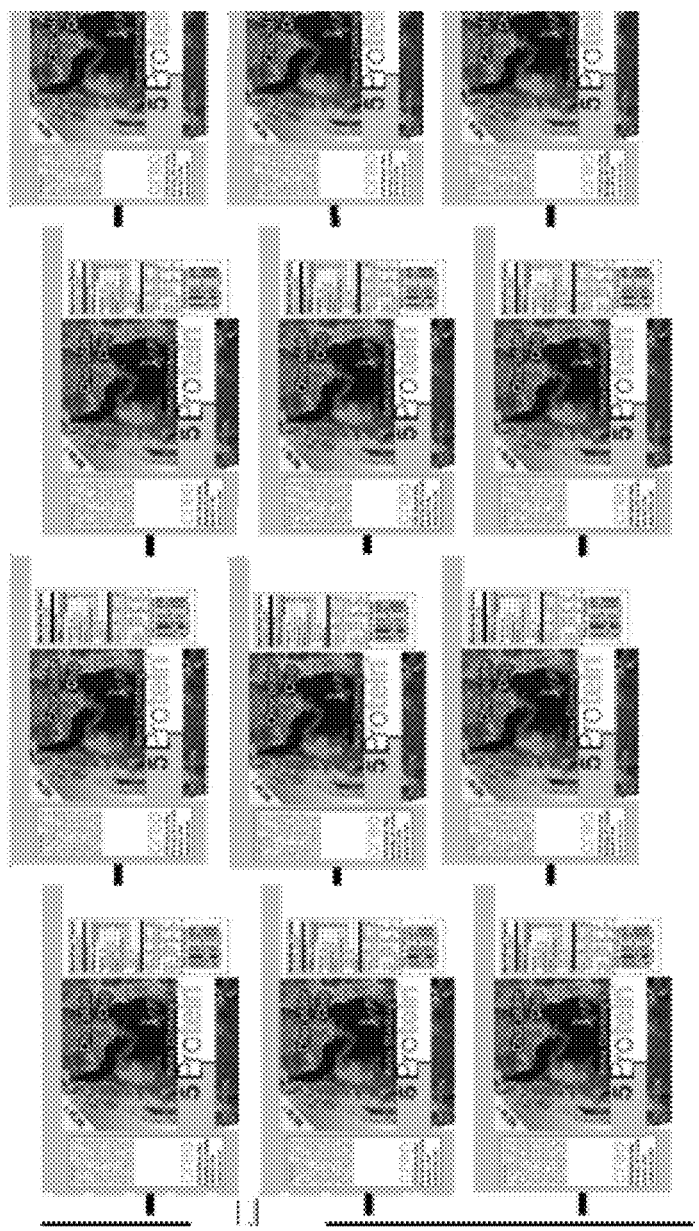
FIG. 8 shows a halftone rendered image (prior art)
Figure 9:
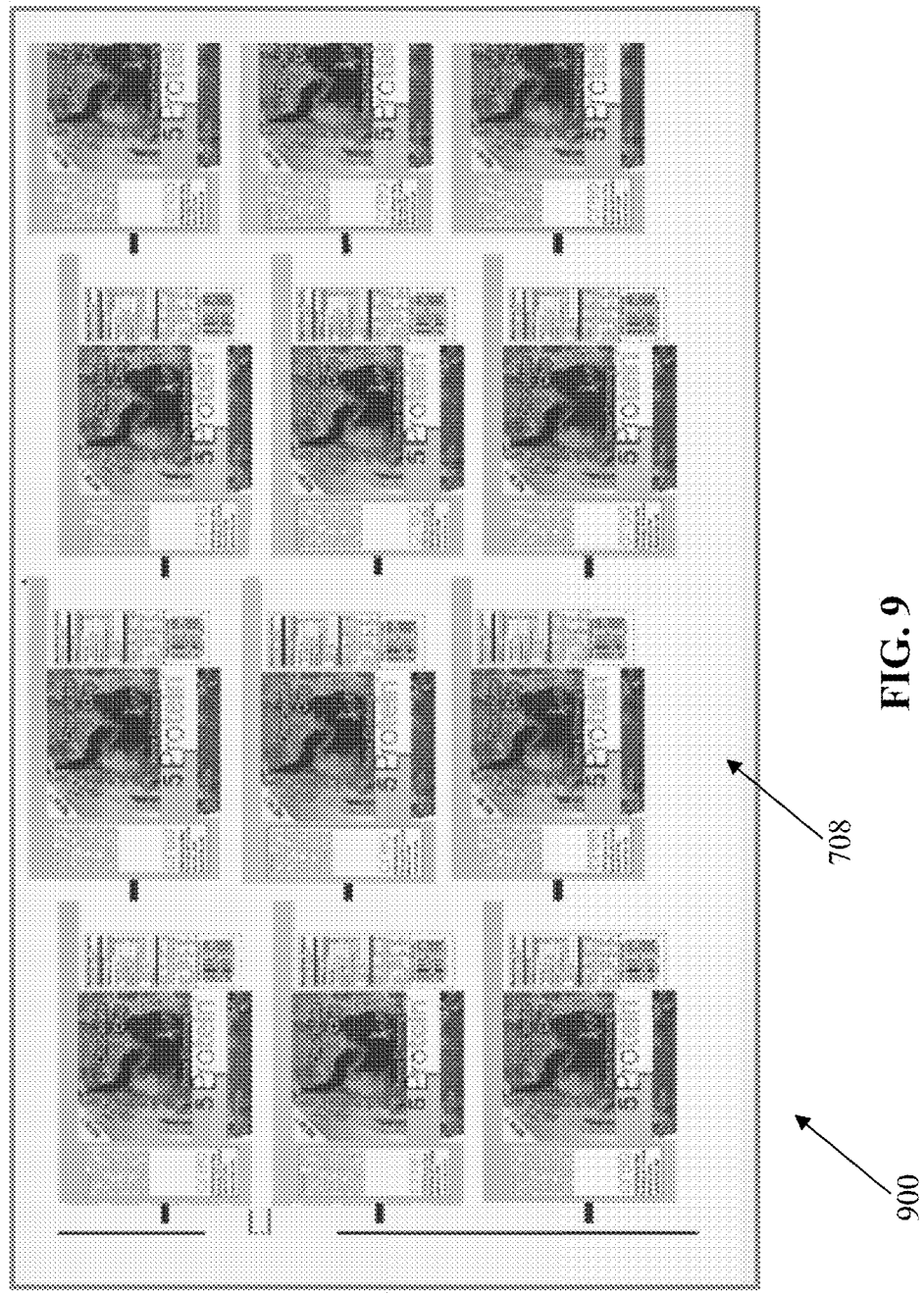
FIG. 9 shows a rendered image on flexographic plate (prior art)
Figure 10:
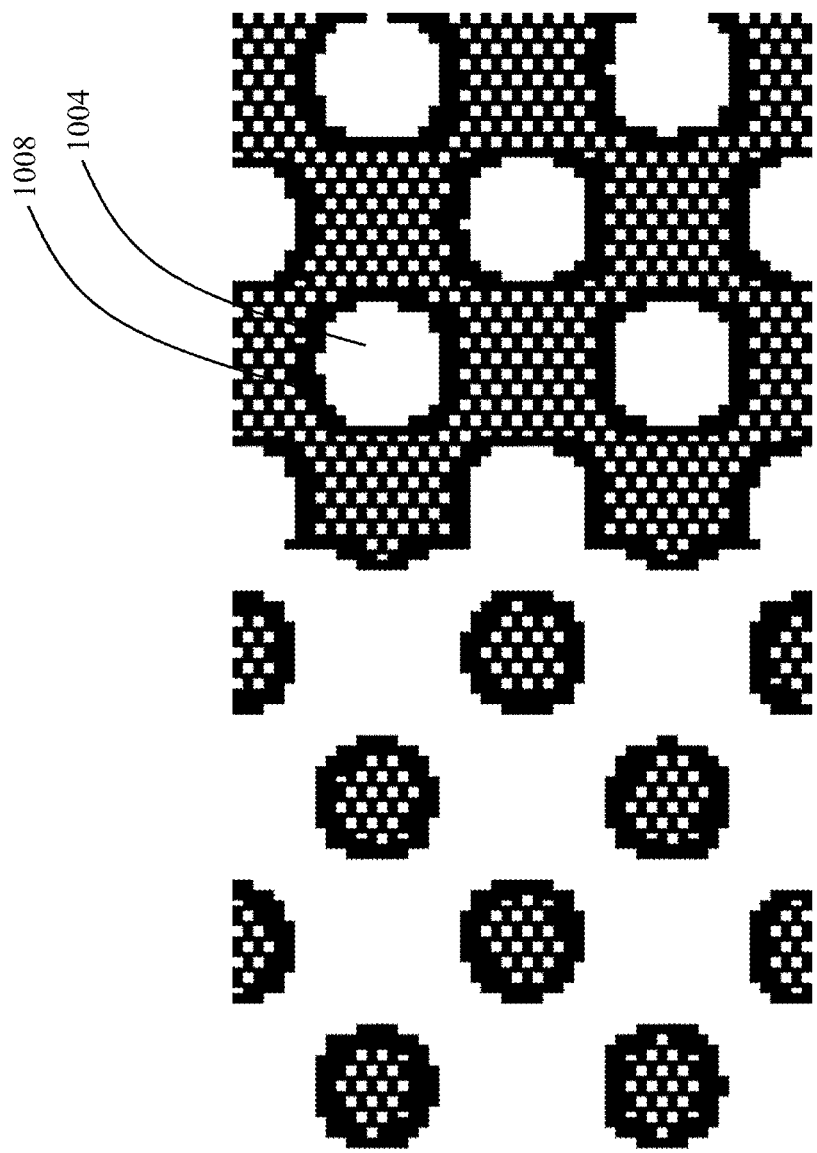
FIG. 10 shows a regularly spaced pattern.

FIG. 8 shows a halftone rendered image 800. The rendered image 800 was prepared by DFE 604, to be further imaged on substrate 708. FIG. 9 shows rendered image 800 imaged by imaging head 720 on substrate 708 forming an imaged substrate 900.

When printing on certain plastic substrates, such as Low-density Polyethylene (LDPE), voids appear on the trailing edge of large solid relief areas. These voids are due to entrapment of air bubbles between the plate and the substrate. A solution is to allow slightly deeper valleys in the pattern and slightly larger gaps between pixels in the interior of the relief. This allows ink and air to flow more freely.

White ink is used on clear plastic material as the base for printing spot and process colors. The volume of white ink required to achieve a good level of opacity is much higher than the volume used for the color inks Consequently, the patterns used for color printing are too fine to work for the white inks Therefore, coarser patterns that scale with ink volume are required. The exposed data is analyzed to find areas which represent the interior of the relief 1104 and the edges areas 1108. This allows different treatment to areas 1104 and areas 1108 with respect to patterning.

Figure 11:
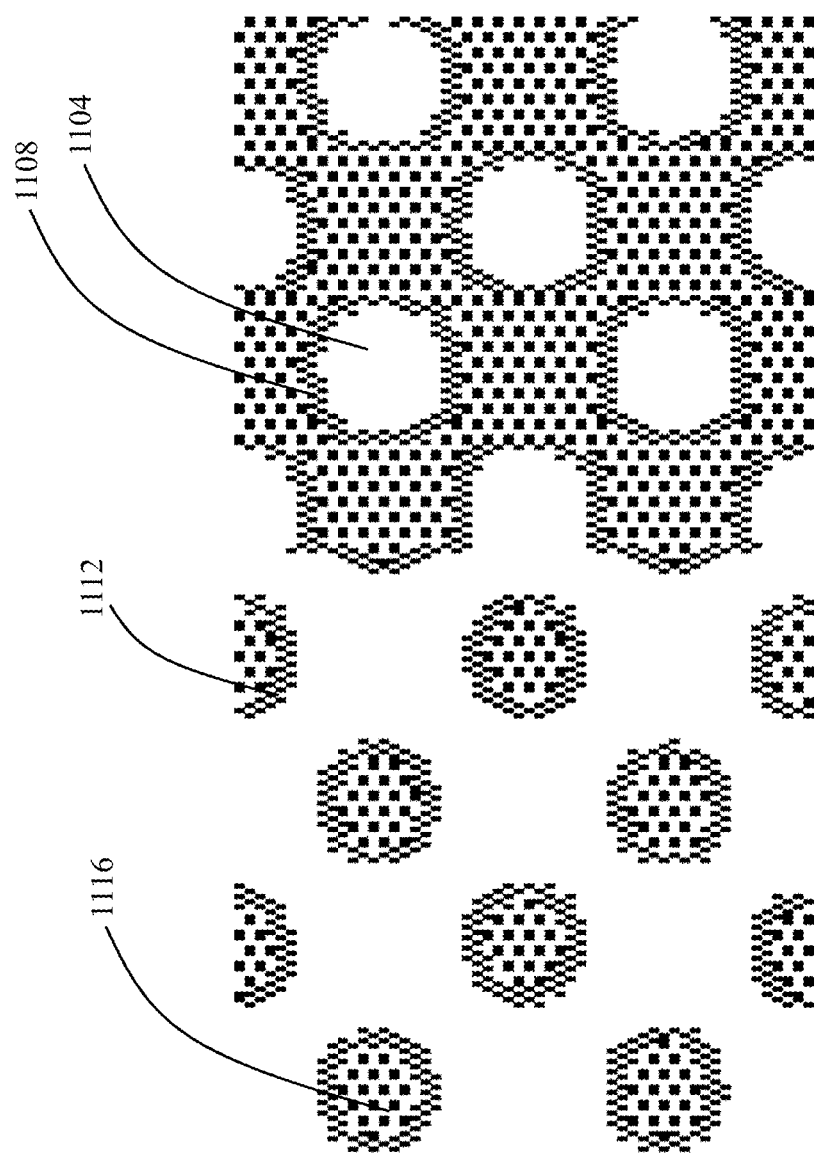
FIG. 11 shows a printed scheme adapted to eliminate trailing edge voids by forming of two surface patterns.

FIG. 11 shows a printed scheme adapted to eliminate trailing edge voids by forming two surface patterns. The first pattern is optimized for the edges of the relief 1108. The second is optimized for the interior of the relief 1104 and is adapted to the particular application.

Figure 12:
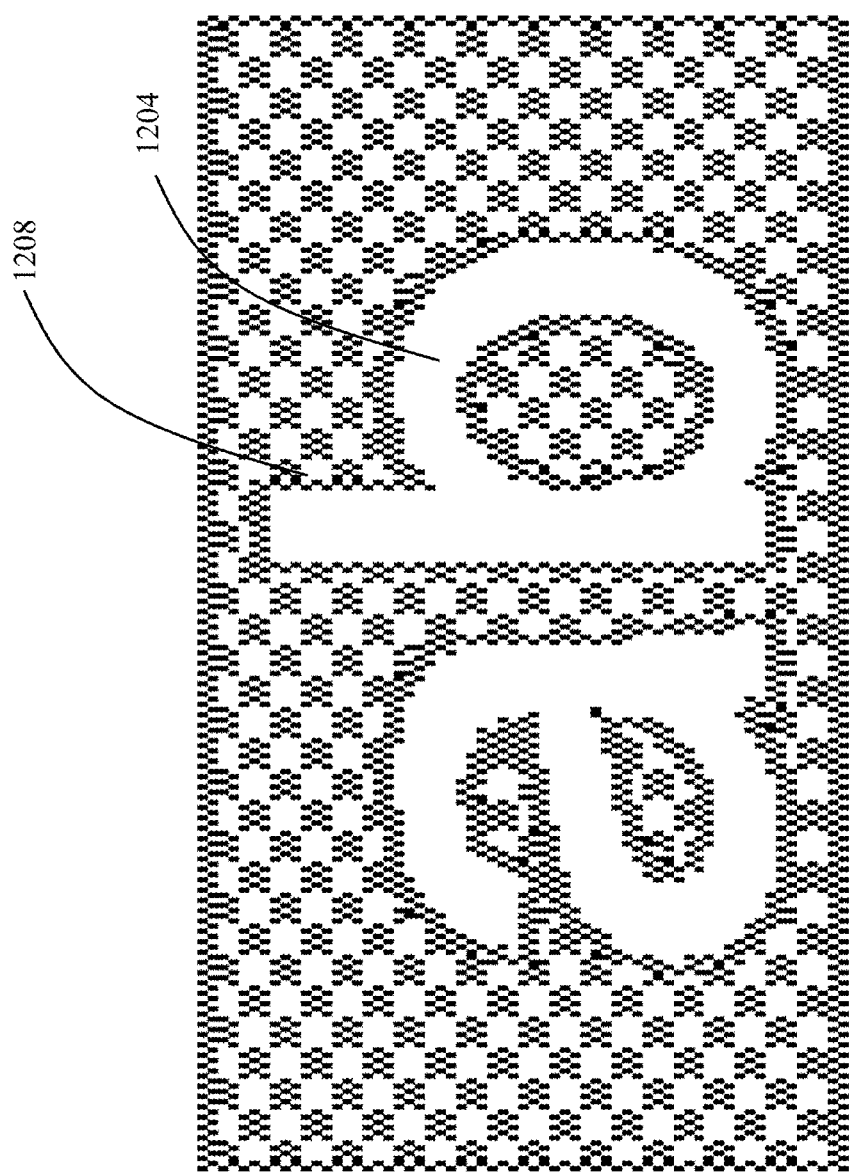
FIG. 12 shows larger valleys in the pattern adapted for white ink.

White ink requires larger valleys in the pattern as is illustrated by FIG. 12. Larger interior pattern 1204 allows entrapped air to move more freely. The edge pattern 1208 preserves the dot shape while still allows the trapped air to squeeze through at the corners of the stretched checker board.

Figure 13:
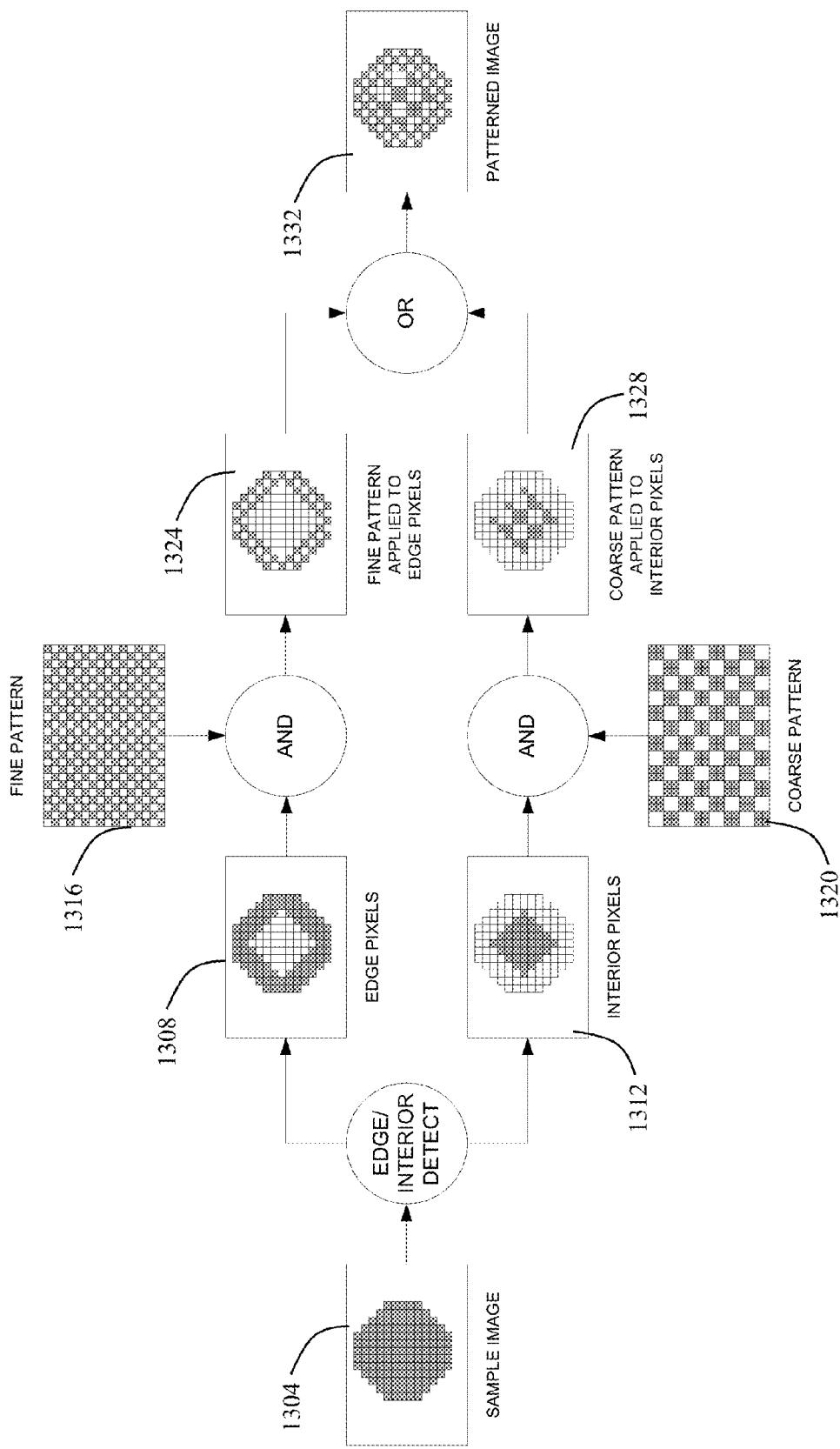
FIG. 13 shows a block diagram illustrating the steps of the patterning method.

FIG. 13 contains a block diagram that shows the steps of the patterning method. An image 1304 is provided and an edge detection step is executed on image 1304. The results of the edge detection step are edge pixel mask 1308 and interior pixel mask 1312. Fine pattern 1316 is applied on edge pixel mask 1308 to create a fine patterned edge. A coarse pattern 1320 is applied on interior pixel mask 1312 to create a coarse patterned interior pixels structure 1328. The final step is to combine the fine patterned edge 1324 and the coarse patterned interior 1328 into a patterned image 1332.

Figure 14:
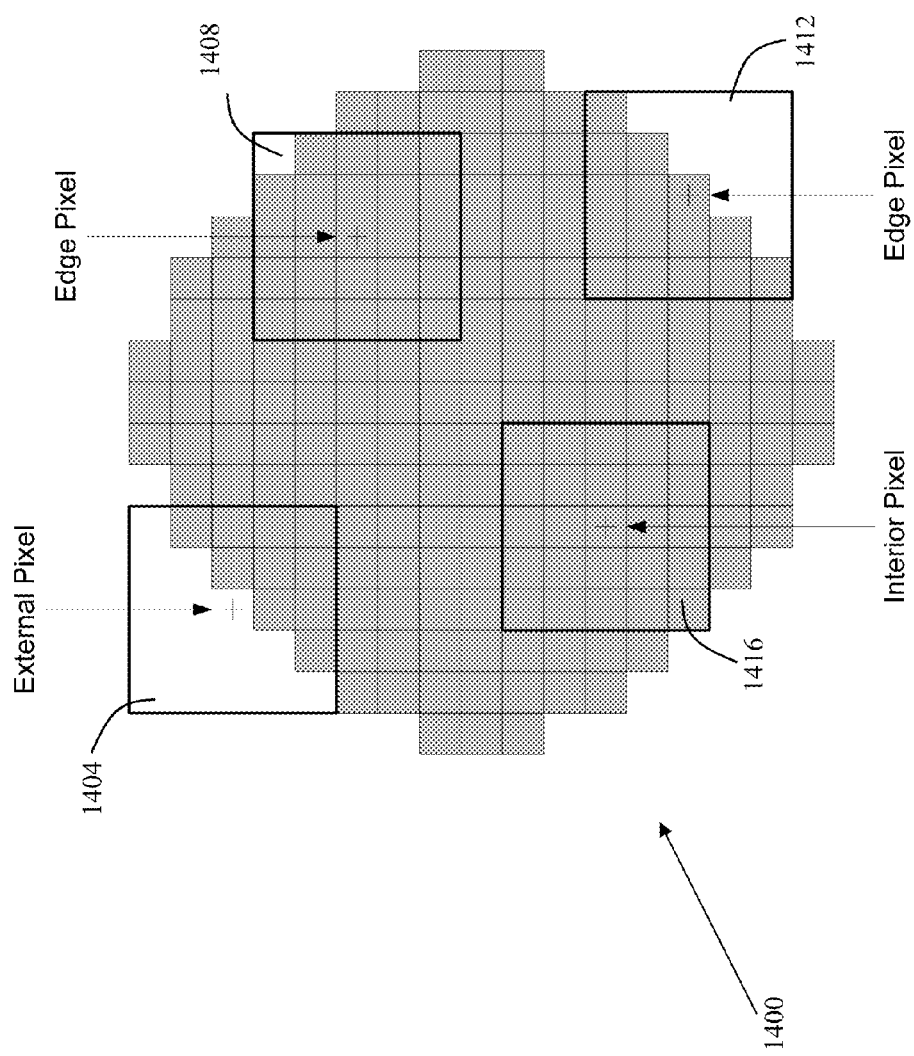
FIG. 14 showing decisions on edge, interior and external pixels according to pixel window on a pixel sample.

Exposed relief pixels are selected to be part of the edge region or interior region based on the pixels proximity to an edge of the relief. In the preferred embodiment, the method used to achieve this partition is a 5×5 pixel window. The pixels in the window are examined. In the case that all the pixels in the window are exposed pixels then the center pixel is deemed to be an interior pixel. If the center pixel is an exposed pixel and at least one of the other pixels in the window is not an exposed pixel, then the center pixel is deemed to be an edge pixel. The result of this operation is to designate an interior pixel mask and an edge pixel mask. All other pixels in the image are deemed exterior pixels and are ignored. FIG. 14 illustrates how windowing is applied to a representative sample of pixels 1400. A decision to designate a pixel as external is decided when the pixel window is placed in position 1404 relative to sample pixels 1400. Similarly in positions 1408 and 1412 the decision is made to designate an edge pixel. An interior pixel is designated for position 1416.

A fine texture pattern is chosen for the edge pixels and the preferred pattern is a 5×10 micron stretched checkerboard. The fine pattern 1112 is repeated in both dimensions to span the width and height of the rendered image forming the fine pattern image, which is used at the edge areas 1108. A coarser pattern 1116 is chosen for the interior pixels. Some examples are shown in FIGS. 11 and 12. The exact choice is based on the thickness of the ink being printed. The coarse pattern is repeated in both dimensions to span the width and height of the rendered image forming coarse pattern image.

Exposed pixels in the rendered image are replaced by pixels from the fine pattern image and the coarse pattern image. For every pixel in the rendered image, if the corresponding pixel in the fine pattern mask is set then that pixel in the rendered image is replaced by the corresponding pixel in the fine pattern image. Similarly, for every pixel in the rendered image, if the corresponding pixel in the coarse pattern mask is set then that pixel in the rendered image is replaced by the corresponding pixel in the coarse pattern image.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents. The principles of the present invention may similarly be applied to other types of electrical storage cells, such as energy-storage capacitors.

The invention has been described in detail with particular reference to certain preferred embodiments thereof, but it will be understood that variations and modifications can be effected within the scope of the invention.

PARTS LIST 10 ink
12 rubber roller
14 Anilox roller
16 doctor blade
18 printing plate cylinder
20 flexographic printing plate
22 substrate
24 impression cylinder
200 cross-section of plate
204 solid area
208 isolated dot
212 array of closely spaced dots created by a halftone screen
216 plate relief
220 plate floor
304 stretched checkerboard pattern
308 stochastic patterning
504 fine pattern
604 digital front end (DFE)
608 imaging device
612 interface line
700 imaging system
704 rotating cylinder
708 substrate
712 imaged data on substrate
716 screw
720 imaging head
728 controller
732 carriage
800 rendered halftone image to be imaged on substrate
900 rendered image imaged on substrate
1004 coarse pattern
1008 2 pixel keep-away
1104 pattern for the relief interior
1108 pattern for the relief edges
1112 fine pattern
1116 course pattern
1204 white color interior pattern
1208 white color edge pattern
1304 image
1308 edge pixels
1312 interior pixels
1316 fine pattern
1320 coarse pattern
1324 fine pattern applied to edge pixels
1328 coarse pattern applied to interior pixels
1332 patterned image
1400 pixels sample
1404 external pixel decision
1408 edge pixel decision
1412 edge pixel decision
1416 interior pixel decision

The invention claimed is:

1. A system for forming a flexographic plate comprising;
a digital front end (DFE) for rendering a halftone image;
wherein the DFE identifies pixels in the halftone image as being part of an edge region or interior region based on the pixels proximity to an image edge feature;
wherein the DFE alters each of the edge regions in the halftone image with fine pattern data to form a portion of an altered half tone image;
wherein the DFE alters each of the interior regions in the halftone image with coarse pattern data to form another portion of the altered half tone image;
wherein the altered half tone image is an image for imaging a flexographic plate;
an interface for transmitting the altered half tone image to an imaging device; and
wherein the imaging device images the flexographic plate with the altered half tone image.

2. The system according to claim 1 wherein the fine pattern is a checkerboard pattern.

3. The system according to claim 1 wherein the coarse pattern is a checkerboard pattern.

4. The system according to claim 1 wherein the DFE applies a pixel window matrix to identify edge pixels and interior pixels.

5. The system according to claim 4 wherein the pixel window is a five-by-five pixel matrix.

6. The system according to claim 4 wherein pixel window matrix determines a distance between the edge region and the interior region.

7. A system for forming a flexographic plate comprising:
a digital front end (DFE) for providing rendering a halftone image;
wherein the DFE detects an edge region of image features of the halftone image and alters edge region data with a fine pixel mask pattern to form a fine pattern edge,
and wherein the DFE detects an interior region of image features of the halftone image and alters interior region data with a coarse pixel mask pattern to form a coarse patterned interior, and wherein the DFE combines the fine patterned edge and the coarse patterned interior into an altered patterned halftone image;
wherein the altered patterned half tone image is an image for imaging a flexographic plate;
an interface which transmits the altered patterned halftone image to an imaging device; and wherein the imaging device images the flexographic plate with the altered patterned half tone image.

* * * * *